United States Patent
Matsuura et al.

(10) Patent No.: US 6,855,974 B2
(45) Date of Patent: Feb. 15, 2005

(54) FERROELECTRIC CAPACITOR, PROCESS FOR PRODUCTION THEREOF AND SEMICONDUCTOR DEVICE USING THE SAME

(75) Inventors: Osamu Matsuura, Kanagawa (JP); Kenji Maruyama, Kanagawa (JP); Kazuaki Takai, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/743,814

(22) Filed: Dec. 24, 2003

(65) Prior Publication Data

US 2004/0135183 A1 Jul. 15, 2004

(30) Foreign Application Priority Data

Jan. 8, 2003 (JP) .......................... 2003-002577

(51) Int. Cl.$^7$ ............................. H01L 31/062
(52) U.S. Cl. ................. 257/295; 257/421; 257/E27.104
(58) Field of Search ................. 257/295, 421, 257/E27.104

(56) References Cited

U.S. PATENT DOCUMENTS

| | | | | |
|---|---|---|---|---|
| 6,121,647 A | * | 9/2000 | Yano et al. | ................. 257/295 |
| 6,664,116 B2 | * | 12/2003 | Li et al. | ........................ 438/3 |

FOREIGN PATENT DOCUMENTS

| | | |
|---|---|---|
| JP | 6-68529 | 3/1994 |
| JP | 6-280023 | 10/1994 |
| JP | 8-31951 | 2/1996 |
| JP | 2000-40799 | 2/2000 |
| JP | 2000-232102 | 8/2000 |
| JP | 2001-284549 | 10/2001 |
| JP | 2002-16234 | 1/2002 |

* cited by examiner

*Primary Examiner*—David Nelms
*Assistant Examiner*—Tu-Tu Ho
(74) *Attorney, Agent, or Firm*—Westerman, Hattori, Daniels & Adrian, LLP

(57) ABSTRACT

A ferroelectric capacitor includes a pair of electrodes, and at least one ferroelectric held between the pair of electrodes, in which the ferroelectric includes a first ferroelectric layer having a surface roughness (RMS) determined with an atomic force microscope of 10 nm or more; and a second ferroelectric layer being arranged adjacent to the first ferroelectric layer and having an RMS of 5 nm or less. A process produces such a ferroelectric capacitor by forming a first ferroelectric layer on or above one of a pair of electrodes at a temperature equal to or higher than a crystallization temperature at which the first ferroelectric layer takes on a ferroelectric crystalline structure, and forming a second ferroelectric layer on the first ferroelectric layer at a temperature lower than a crystallization temperature at which the second ferroelectric layer takes on a ferroelectric crystalline structure.

14 Claims, 10 Drawing Sheets

FERROELECTRIC CAPACITOR, PROCESS FOR PRODUCTION THEREOF AND SEMICONDUCTOR DEVICE USING THE SAME

CROSS-REFERENCE TO RELATED APPLICATIONS

This application is based upon and claims the benefits of the priority from the prior Japanese Patent Application No. 2003-002577, filed in Jan. 8, 2003, the entire contents of which are incorporated herein by reference.

BACKGROUND OF THE INVENTION

1. Field of the Invention

The present invention relates to a ferroelectric capacitor which shows less fatigue and is suitable as a large-capacity nonvolatile memory, a process for efficiently producing the ferroelectric capacitor, and a high-performance semiconductor device having the ferroelectric capacitor.

2. Description of the Related Art

Ferroelectrics have excellent ferroelectricity, piezoelectricity and pyroelectricity and are widely used in, for example, a variety of memories, actuators, and sensors. For example, such ferroelectrics have been applied to nonvolatile memories by utilizing the hysteresis of the ferroelectrics. Certain ferroelectric capacitors comprising a lower electrode, a ferroelectric, and an upper electrode arranged in this order on a substrate are known as nonvolatile memories.

Pb-containing materials such as $Pb(Zr,Ti)O_3$ [PZT] having excellent ferroelectricity have been suitably used as materials for the ferroelectrics. These ferroelectrics may be formed, for example, by a sol-gel method, sputtering or metalorganic chemical vapor deposition (MOCVD). Among them, the metalorganic chemical vapor deposition (MOCVD) has been often employed, since it can yield ferroelectric crystals which exhibit high ferroelectricity even when finely divided and have a high density while it also provides a good step coverage. Such a ferroelectric capacitor has been conventionally formed by forming a lower electrode with the use of a noble metal such as Pt or Ir or an electrically conductive oxide such as $IrO_x$, wherein x is more than 0 and is 2 or less; forming a ferroelectric film of lead zirconate titanate (PZT) on the lower electrode by MOCVD; and forming an upper electrode on the ferroelectric film.

However, when the ferroelectric capacitor having the thus-formed ferroelectric is applied to a nonvolatile memory and the ferroelectric undergoes repetitive switching process (repetitive polarization reversal), it induces "fatigue (polarization fatigue)" in which the polarization of the ferroelectric decreases. To reduce the "fatigue", i.e., to improve fatigue properties, Japanese Patent Application Laid-Open (JP-A) Nos. 10-173141, 2001-144264, 2001-267518, and 2002-100740 each propose the use of an oxide electrode in the ferroelectric capacitor. Another attempt has been made to form a ferroelectric capacitor having an $IrO_2/PZT/Ir$ multilayer structure by MOCVD, but the resulting ferroelectric capacitor does not have sufficiently improved fatigue properties.

SUMMARY OF THE INVENTION

Under these circumstances, an object of the present invention is to provide a ferroelectric capacitor which shows reduced fatigue and is suitable as a large-capacity nonvolatile memory, a process for efficiently producing the ferroelectric capacitor, and a high-performance semiconductor device having the ferroelectric capacitor.

The present invention provides a ferroelectric capacitor including a pair of electrodes, and at least one ferroelectric held between the pair of electrodes, wherein the at least one ferroelectric has a first ferroelectric layer having a surface roughness (root mean square) determined with an atomic force microscope of 10 nm or more; and a second ferroelectric layer being arranged adjacent to the first ferroelectric layer and having a surface roughness (RMS) determined with an atomic force microscope of 5 nm or less.

The ferroelectric in the ferroelectric capacitor includes the first ferroelectric layer arranged on or above a lower electrode of the pair of electrodes and having a rough surface, and the second ferroelectric layer arranged adjacent to the first ferroelectric layer and having a smooth surface. The ferroelectric capacitor can minimize defects at the interface between the second ferroelectric layer and the other electrode (upper electrode) of the pair of electrodes to thereby prevent charges from being trapped in such defects. Thus, the ferroelectric capacitor is resistant to "fatigue" in which the polarization decreases upon repetitive switching process.

The present invention further provides a process for producing a ferroelectric capacitor including a pair of electrodes and at least one ferroelectric held between the pair of electrodes, the process including the steps of forming a first ferroelectric layer on or above one of the pair of electrodes at a temperature equal to or higher than a crystallization temperature at which the first ferroelectric layer takes on a crystalline structure displaying ferroelectricity; and forming a second ferroelectric layer adjacent to the first ferroelectric layer at a temperature lower than a crystallization temperature at which the second ferroelectric layer takes on a crystalline structure displaying ferroelectricity. According to this process, the first ferroelectric layer has a crystalline structure but the second ferroelectric layer does not have a crystalline structure but an amorphous structure before the formation of the other electrode (upper electrode). Thus, the ferroelectric capacitor is effectively prevented from inducing defects at the interface between the upper electrode and the second ferroelectric layer.

The present invention still further provides a semiconductor device including a substrate and a ferroelectric capacitor arranged on or above the substrate, in which the ferroelectric capacitor is the ferroelectric capacitor of the present invention. The ferroelectric capacitor is resistant to defects at the interface between the second ferroelectric layer and an upper electrode arranged thereon and can significantly reduce "fatigue". The resulting semiconductor device having the ferroelectric capacitor has a large capacity, shows less variation in polarization even upon repetitive switching process (repetitive polarization reversal), can be rewritten at high speed in a large number of cycles and consumes less power. The semiconductor device is therefore suitable as, for example, a large-capacity nonvolatile memory in personal digital assistants, memory backup for game machines, displays, personal computers, printers, televisions, digital cameras, and other office automation appliances.

Further objects, features and advantages of the present invention will become apparent from the following description of the preferred embodiments with reference to the attached drawings.

DESCRIPTION OF THE PREFERRED EMBODIMENTS

Ferroelectric Capacitor

Figure 1:
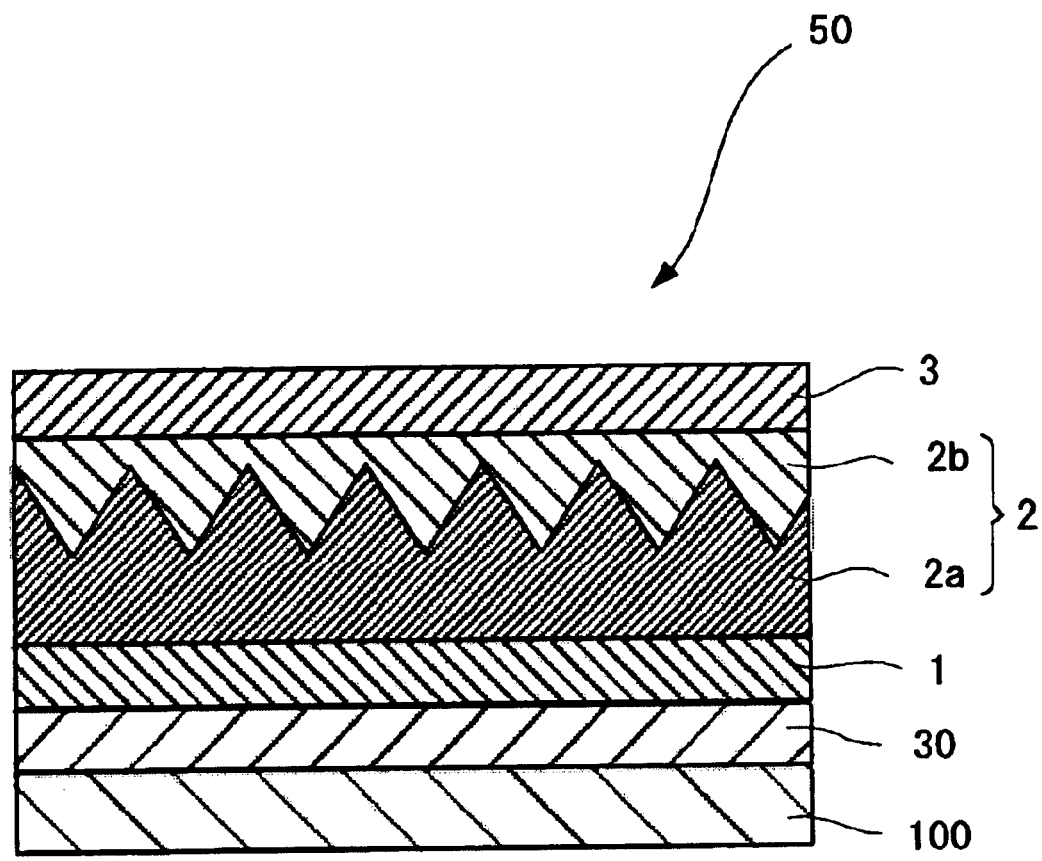
FIG. 1 is a schematic sectional view of a ferroelectric capacitor as an example of the present invention.

The ferroelectric capacitor of the present invention comprises a pair of electrodes and at least one ferroelectric held between the pair of electrodes and may further comprise additional layers between the pair of electrodes.

The pair of electrodes are not specifically limited, may be selected according to purposes and can be, for example, a lower electrode and an upper electrode in combination.

Lower Electrode

The lower electrode for use in the present invention is not specifically limited, may be selected according to purposes, and examples of its materials are (1) a noble metal such as Pt, Ir, and Au, (2) Ni with at least one element selected from Sc, Ti, V, Cr, Mo, Fe, Co, Cu, Y, Zr, Nb, Mn, Ta, W, Ir, and Pt, (3) electrically conductive oxides such as IrO$_x$, wherein x is more than 0 and is 2 r less, RuO$_2$, SrRuO$_3$, and La$_{2-x}$Sr$_x$CuO$_4$, wherein x is more than 0 and is 1 or less. Among them, Ir is preferred for better inhibition of diffusion of Pb and O.

The lower electrode may have either a single-layer structure or a multilayer structure. When Ir is used, the lower electrode may comprise a single layer of Ir or a multilayer having a substrate or a layer of, for example, Ti or Si and an Ir layer arranged on or above the substrate or the layer. The lower electrode preferably has a multilayer structure for better alignment of the ferroelectric such as PZT.

A suitable example of the multilayer structure is an Ir/Ti comprising a Ti layer about 10 nm thick and an Ir layer about 150 nm thick.

The thickness of the Ir layer in the single-layer structure or in the multilayer structure is not specifically limited, may be set according to purposes and is preferably from 10 nm to 1000 nm and more preferably from 50 nm to 500 nm.

The lower electrode can be formed according to any procedure not specifically limited, but is preferably formed by sputtering.

Ferroelectric

The ferroelectric comprises at least a first ferroelectric layer arranged on or above the lower electrode and a second ferroelectric layer arranged adjacent to the first ferroelectric layer.

First Ferroelectric Layer

The first ferroelectric layer has a surface roughness RMS determined with atomic force microscope (AFM) of 10 nm or more. The first ferroelectric layer which has been formed, for example, by chemical vapor deposition (CVD) generally has a surface roughness RMS of 10 nm or more.

The first ferroelectric layer preferably has a perovskite crystal structure. The crystals constituting the first ferroelectric layer preferably have a columnar structure for higher density and higher strength.

The perovskite crystal structure is represented by the formula: ABX$_3$. In the perovskite crystal structure, a cation in the A-site and an anion in the X-site have similar sizes, and another cation in the B-site having a smaller size than the cation in the A-site resides in a cubic system unit cell constituted by the A-site and X-site. Most of compounds having such a perovskite crystal structure have a structure slightly distorted from an ideal cubic crystal structure at room temperature. Owing to the distortion, i.e., asymmetry in structure, the perovskite crystal structure exhibits a variety of functions.

Materials for the ferroelectric constituting the first ferroelectric layer are not specifically limited, may be selected according to purposes, and examples are Pb(Zr,Ti)O$_3$ [PZT], SrBi$_2$Ta$_2$O$_9$ [SBT], and Bi$_4$Ti$_3$O$_{12}$ [BIT]. Each of these materials may be used alone or in combination. Among them, Pb(Zr,Ti)O$_3$ [PZT] is preferred for its larger residual dielectric polarization (remanence).

It is preferred that the first ferroelectric layer comprises Pb(Zr,Ti)O$_3$ [PZT] having a perovskite crystal structure and the second ferroelectric layer comprises Pb(Zr,Ti)O$_3$ [PZT] having a perovskite crystal structure converted from an amorphous structure.

The first ferroelectric layer is preferably formed at a temperature equal to or higher than a crystallization temperature at which the first ferroelectric layer takes on a crystalline structure displaying ferroelectricity. The crystallization temperature varies depending on the material for the ferroelectric. For example, when the first ferroelectric is Pb(Zr,Ti)O$_3$ [PZT], it is preferably formed at a temperature of 500° C. or higher and more preferably from 500° C. to 700° C.

The term "crystal structure displaying ferroelectricity" as used herein means and includes, for example, the perovskite crystal structure.

The first ferroelectric layer can be formed according to any procedure not specifically limited, such as chemical solution deposition (CSD), metalorganic chemical vapor deposition (MOCVD), pulse laser deposition (PLD), sol-gel method, and sputtering. Among such procedures, MOCVD is preferred for better step coverage and for higher density and higher strength of the crystals.

Suitable source gas and MOCVD conditions for the formation of the first ferroelectric layer may vary depending on, for example, the type of the first ferroelectric layer. When the first ferroelectric layer comprises Pb(Zr,Ti)O$_3$ [PZT], a Pb source gas, a Zr source gas, and a Ti source gas may be used as the source gas.

The Pb source gas includes, for example, Pb(DPM)$_2$; the Zr source gas includes, for example, Zr(dmhd)$_4$; the Ti source gas includes, for example, Ti(O-iPr)$_2$(DPM)$_2$, wherein DPM represents 2,2,6,6,-tetramethyl-3,5-heptanedionato, dmhd represents 2,2-dimethyl-3,5-heptanedionato, and O-iPr represents isopropoxido.

Each of the flow rates of the Pb source gas, the Zr source gas, and the Ti source gas is from about 0.01 ml/min. to about 1.0 ml/min., and preferably from 0.1 ml/min. to 0.5 ml/min.

The oxygen partial pressure in the source gas is not specifically limited, may be set according to purposes and is, for example, from about 1 Torr to about 10 Torr (about 133

Pa to 1333 Pa), and preferably from 3 Torr to 7 Torr (from 399 Pa to 933 Pa).

The source gas can be prepared according to any procedure not specifically limited and may be prepared by dissolving materials for the source gas in a solvent such as tetrahydrofuran (THF) to yield a solution and vaporizing the solution.

The solution can be vaporized using a conventional vaporizer.

The vaporized source gas is mixed with, for example, oxygen gas to a predetermined oxygen partial pressure and is then sprayed to the lower electrode using a showerhead or another device. Thus, the first ferroelectric layer is formed on or above the lower electrode.

The conditions for the formation of the first ferroelectric layer are not specifically limited and may be set according to purposes. A suitable reaction temperature varies depending on the material of the first ferroelectric layer. When the first ferroelectric layer comprises $Pb(Zr,Ti)O_3$ [PZT], the reaction temperature is generally from about 580° C. to about 620° C.

The thickness of the first ferroelectric layer is not specifically limited, may be set according to purposes and is preferably from about 10 nm to about 1000 nm and more preferably from 50 nm to 500 nm.

Second Ferroelectric Layer

The second ferroelectric layer is arranged adjacent to the first ferroelectric layer and has a surface roughness (RMS) determined by AFM of 5 nm or less, preferably 3 nm or less. More preferably, the second ferroelectric layer has a substantially flat or smooth surface.

The second ferroelectric layer having a surface roughness RMS exceeding 5 nm may partially have excessively thin portions.

The second ferroelectric layer is preferably so arranged as to fill depressions on the surface of the first ferroelectric layer having a surface roughness (RMS) determined by AFM of 10 nm or more to thereby constitute a substantially flat surface.

The second ferroelectric layer preferably has a perovskite crystal structure converted from an amorphous structure. The second ferroelectric layer preferably has a granular structure as its crystal structure so as to fill depressions on the rough surface of the first ferroelectric layer.

The second ferroelectric layer may be formed at a temperature lower than a crystallization temperature at which the second ferroelectric layer takes on a crystalline structure displaying ferroelectricity. The crystallization temperature varies depending on the material of the second ferroelectric layer. When the second ferroelectric layer comprises $Pb(Zr,Ti)O_3$ [PZT], the second ferroelectric layer is preferably formed at a temperature lower than 500° C.

The material for the ferroelectric constituting the second ferroelectric layer is not specifically limited, as long as it can have an amorphous structure under some film-forming conditions, and can be the same material as the first ferroelectric layer. For better film formation and higher strength of the ferroelectric, a ferroelectric having the same composition as the first ferroelectric layer is preferably used as the material.

The second ferroelectric layer preferably comprises $Pb(Zr,Ti)O_3$ [PZT], except with its A-site in the perovskite crystal structure doped with, for example, La, Sr, Ca, or Ba.

It is also preferred that the second ferroelectric layer comprises $Pb(Zr,Ti)O_3$ [PZT], except with its B-site in the perovskite crystal structure doped with, for example, Nb, Bi, Ta or W.

Preferred embodiments of the ferroelectric capacitors of the present invention are, for example, (1) a ferroelectric capacitor in which the first ferroelectric layer comprises $Pb(Zr,Ti)O_3$ [PZT] having a perovskite crystal structure, and the second ferroelectric layer comprises $Pb(Zr,Ti)O_3$ [PZT] having a perovskite crystal structure which has been converted from an amorphous structure and has an A-site doped with at least one selected from La, Sr and Ca; and (2) a ferroelectric capacitor, in which the first ferroelectric layer comprises $Pb(Zr,Ti)O_3$ [PZT] having a perovskite crystal structure, the second ferroelectric layer comprises $Pb(Zr,Ti)O_3$ [PZT] having a perovskite crystal structure which has been converted from an amorphous structure and has a B-site doped with at least one selected from Nb and Bi.

By doping the second ferroelectric layer with a dopant, Pb defects at the interface between the upper electrode and the second ferroelectric layer can be effectively inhibited.

The second ferroelectric layer can be formed adjacent to the first ferroelectric layer according to any procedure not specifically limited. Examples of the procedure are chemical solution deposition (CSD), metalorganic chemical vapor deposition (MOCVD), pulse laser deposition (PLD), sol-gel method, and sputtering.

Each of these procedures can be used alone or in combination. Among them, sputtering is preferred for easier formation of an amorphous film with less impurities.

Sputtering conditions for the formation of the second ferroelectric layer on the first ferroelectric layer are not specifically limited and can be selected from among normal production conditions for ferroelectric films by sputtering.

For example, the $Pb(Zr,Ti)O_3$ [PZT] having an amorphous structure can be formed at normal temperature at an input power of sputtering of 1.5 kW using a sintered target having a composition of $(Pb,La,Ca,Sr)(Zr,Ti)O_3$ [PLCSZT] in an atmosphere of Ar gas. The pressure in a vacuum chamber is preferably from 1 Torr to 10 Torr (133 Pa to 1333 Pa) and more preferably from 1 Torr to 3 Torr (133 Pa to 399 Pa).

The amorphous structure of the second ferroelectric layer is converted into a perovskite crystal structure in the following manner. The upper electrode is formed on the second ferroelectric layer having the amorphous structure to yield a ferroelectric capacitor, and the entire ferroelectric capacitor is then subjected to a thermal treatment to convert the amorphous structure into the perovskite crystal structure.

The thermal treatment is not specifically limited, may be selected according to purposes and is preferably one of reduced-pressure rapid thermal annealing (RTA) and normal-pressure rapid thermal annealing (RTA) both at a temperature higher than the film forming temperature of the first ferroelectric layer.

Upon the reduced-pressure rapid thermal annealing (RTA), the ferroelectric capacitor is heated at a temperature preferably 40° C. to 100° C. higher, more preferably 50° C. to 90° C. higher, and specifically preferably 60° C. to 80° C. higher than the film forming temperature of the first ferroelectric layer.

The pressure of the reduced-pressure rapid thermal annealing (RTA) is, for example, from 0.1 Torr to 10 Torr (from 13.3 Pa to 1333 Pa).

Upon the normal-pressure rapid thermal annealing (RTA), the ferroelectric capacitor is heated at a temperature preferably 70° C. to 160° C. higher, and more preferably 80° C. to 120° C. higher than the film forming temperature of the first ferroelectric layer.

Upper Electrode

The upper electrode is not specifically limited, may be selected according to purposes and can be, for example, one formed on or above the second ferroelectric layer by sputtering. Conditions for the formation of the upper electrode are not specifically limited and may be set according to purposes.

Materials for the upper electrode are not specifically limited, may be selected according to purposes, but suitable examples are $IrO_2$, $RuO_2$, $SrRuO_3$, $La_{2-x}Sr_xCuO_4$, wherein x is more than 0 and is 1 or less, and other oxides. Among them, $IrO_2$ is preferred for efficiently inhibiting the diffusion of Pb.

The thickness of the upper electrode is not specifically limited, may be set according to purposes and is, for example, from about 10 nm to about 1000 nm, and preferably from 50 nm to 500 nm.

The ferroelectric capacitor can have any structure not specifically limited, such as a planar structure, a two-dimensionally stacked structure, and a three-dimensionally stacked structure.

The ferroelectric capacitor can be produced by any process not specifically limited and is preferably produced by the process for producing a ferroelectric capacitor of the present invention mentioned later.

The ferroelectric capacitors of the present invention can be suitably used in various applications such as semiconductor devices requiring large-capacity ferroelectric capacitors and is specifically suitably used in the semiconductor device of the present invention, mentioned later.

Production Process for Ferroelectric Capacitor

In the process for producing a ferroelectric capacitor of the present invention, the first ferroelectric layer is formed on or above one (lower electrode) of the pair of electrodes at a temperature equal to or higher than a crystallization temperature at which the first ferroelectric layer takes on a crystalline structure displaying ferroelectricity; and the second ferroelectric layer is then formed adjacent to the first ferroelectric layer at a temperature lower than a crystallization temperature at which the second ferroelectric layer takes on a crystalline structure displaying ferroelectricity.

In the process, it is preferred that the first ferroelectric layer is formed on or above the lower electrode at a temperature of 500° C. or higher and more preferably 500° C. to 700° C., and the second ferroelectric layer is then formed adjacent to the first ferroelectric layer at a temperature lower than 500° C.

It is preferred that the upper electrode is formed on the second ferroelectric layer to yield a ferroelectric capacitor, and the entire ferroelectric capacitor is subjected to a thermal treatment to thereby convert the second ferroelectric layer from an amorphous structure to a perovskite crystal structure. The ferroelectric capacitor can be thermally treated under any conditions not specifically limited, as described above.

Thus, the second ferroelectric layer does not have a crystallized structure at the time when the upper electrode is formed thereon, and defects at the interface between the upper electrode and the second ferroelectric layer can be effectively inhibited.

The upper electrode alone may be etched before the thermal treatment of the entire ferroelectric capacitor. In this case, the area of the ferroelectric capacitor to be heated is reduced, and the ferroelectric capacitor can be thermally treated more efficiently, since the peripheral length of the ferroelectric capacitor becomes relatively larger with respect to the area of the ferroelectric capacitor to be heated.

The first and second ferroelectric layers can be formed by any procedure not specifically limited, and preferred examples of such procedures are chemical solution deposition (CSD), metalorganic chemical vapor deposition (MOCVD), pulse laser deposition (PLD), sol-gel method, and sputtering.

The first and second ferroelectric layers are preferably formed by metalorganic chemical vapor deposition (MODVD), respectively, in which the forming temperature of the first ferroelectric layer is higher than the forming temperature of the second ferroelectric layer.

Alternatively, it is preferred that the first ferroelectric layer is formed on or above the lower electrode by metalorganic chemical vapor deposition (MODVD), and the second ferroelectric layer is formed adjacent to the first ferroelectric layer by sputtering.

An embodiment of the process for producing a ferroelectric capacitor of the present invention will be illustrated below.

For example, with reference to FIG. 1, a lower electrode 1 is formed by sputtering to a thickness of about 150 nm on a $SiO_2$ film 30 on a silicon substrate 100. A $Pb(Zr,Ti)O_3$ [PZT] film 2a is formed by MOCVD on the lower electrode 1. More specifically, the $Pb(Zr,Ti)O_3$ [PZT] film 2a is formed at a temperature of 620° C. feeding $Pb(DPM)_2$ as a Pb source at 0.37 ml/min., $Zr(dmhd)_4$ as a Zr source at 0.31 ml/min., and $Ti(O-iPr)_2(DPM)_2$ as a Ti source at 0.21 ml/min. at an oxygen partial pressure of 5 Torr (666 Pa). Each of these materials is dissolved in tetrahydrofuran (THF) in a concentration of 3% by mole to yield a solution, and the solution is conveyed to a vaporizer. The solution containing THF and the material is vaporized at 260° C. in the vaporizer, is mixed with oxygen gas to form a source gas, and the source gas is sprayed to the lower electrode using a showerhead. The film-forming time of the $Pb(Zr,Ti)O_3$ [PZT] film 2a is 480 seconds.

Next, a $Pb(Zr,Ti)O_3$ [PZT] film 2b having an amorphous structure is formed at normal temperature on the $Pb(Zr,Ti)O_3$ [PZT] film 2a. More specifically, the $Pb(Zr,Ti)O_3$ [PZT] film 2b is formed by sputtering at an input power of 1.5 kW using $(Pb,La,Ca,Sr)(Zr,Ti)O_3$ as a target in an atmosphere of Ar gas. A chamber is evacuated and is adjusted to a pressure of 0.5 Pa while supplying the Ar gas.

A film of $IrO_2$ as an upper electrode 3 is formed by sputtering to a thickness of about 200 nm on the $Pb(Zr,Ti)O_3$ [PZT] film 2b having an amorphous structure to form a ferroelectric capacitor 50.

The entire ferroelectric capacitor 50 is then subjected to rapid thermal annealing (RTA) at 725° C. to thereby convert the $Pb(Zr,Ti)O_3$ [PZT] film 2b from the amorphous structure to a perovskite crystal structure. Thus, the ferroelectric capacitor of the present invention can be produced.

The process of the present invention can efficiently produce high-performance ferroelectric capacitors in quantity.

Semiconductor Device

The semiconductor device of the present invention and its production process will be illustrated below.

The semiconductor device of the present invention is not specifically limited and may be selected according to purposes, as long as it comprises a substrate and a ferroelectric capacitor arranged on or above the substrate, in which the ferroelectric capacitor is the ferroelectric capacitor of the present invention.

The semiconductor device can be produced, for example, in the following manner.

Figure 4:
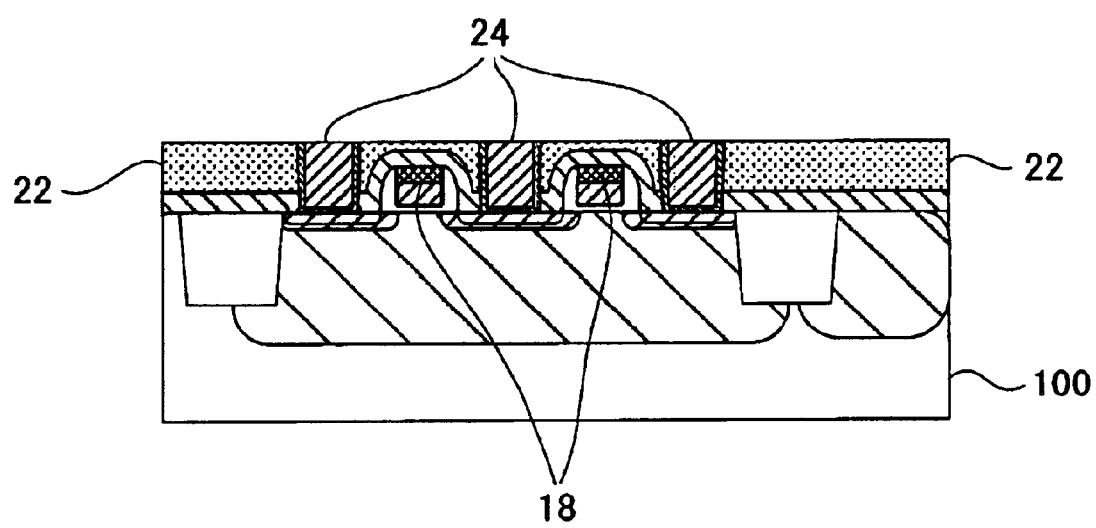
FIGS. 4 through 10 are schematic process drawings showing an example of a process for producing a semiconductor device having the ferroelectric capacitor of the present invention.

With reference to FIG. 4, an element-separation (isolation) dielectric film is formed by local oxidation of silicon (LOCOS) on a surface of a silicon (Si) substrate 100 to define and separate an element region. The element-separation dielectric film can be formed by LOCOS or by forming grooves on the silicon substrate and embedding a dielectric film in the grooves. The silicon substrate 100 may be of either n-type or p-type.

A transistor having a side-wall dielectric film with a gate electrode 18 and a source-drain doped layer is formed in the element region. An interlayer dielectric film 22 composed of a silicone oxide layer is entirely formed by CVD, followed by smoothing the surface of the interlayer dielectric film 22 by chemical-mechanical polishing (CMP).

Next, contact holes reaching the source-drain doped layer are formed in the interlayer dielectric film 22 by photolithography, and a Ti film and a TiN film are sequentially formed by sputtering on the entire surface of the resulting article to form a coherent layer comprising the Ti film and TiN film. Next, a tungsten (W) layer is formed by CVD on the entire surface of the coherent layer. Thus, the coherent layer and the tungsten layer are formed on the interlayer dielectric film 22 and inside the contact holes.

The coherent layer and the tungsten layer are polished by chemical-mechanical polishing so as to expose the surface of the interlayer dielectric film 22 to thereby form electrically conductive plugs 24 comprising the coherent layer and the tungsten layer embedded in the contact holes, as shown in FIG. 4.

Figure 5:
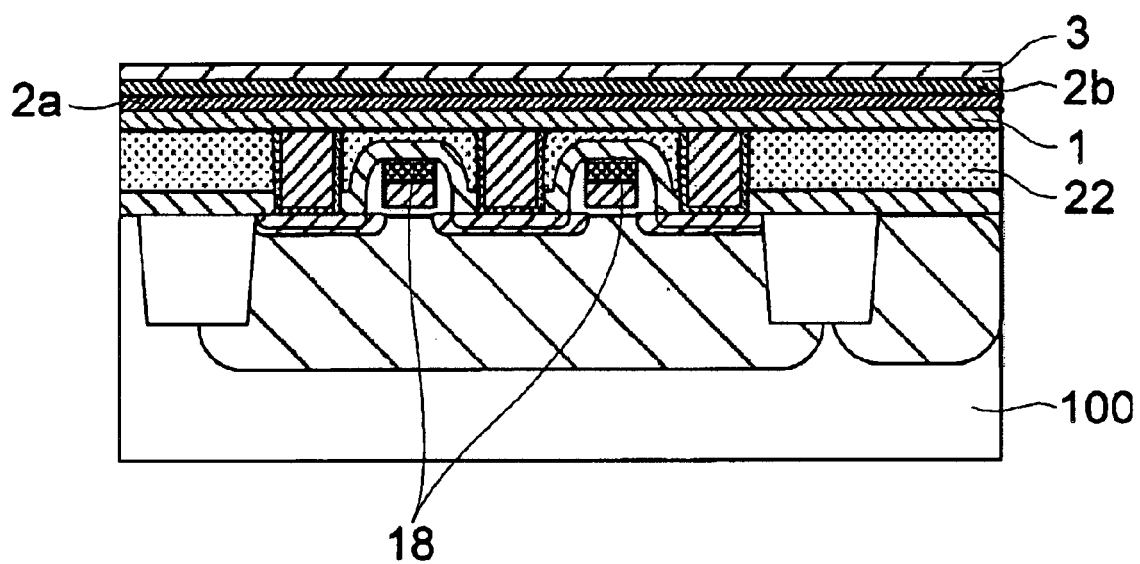

With reference to FIG. 5, a lower electrode 1 composed of Ir is formed by sputtering. A Pb(Zr,Ti)O$_3$ [PZT] layer 2a is formed by MOCVD on the lower electrode 1 heated at 400° C. to 700° C.; a Pb(Zr,Ti)O$_3$ [PZT] layer 2b having an amorphous structure is formed by sputtering on the Pb(Zr,Ti)O$_3$ [PZT] layer 2a; and an upper electrode 3 is formed on the Pb(Zr,Ti)O$_3$ [PZT] layer 2b having an amorphous structure. The entire ferroelectric capacitor is subjected to rapid thermal annealing (RTA) at 725° C. to convert the Pb(Zr,Ti)O$_3$ [PZT] layer 2b from the amorphous structure to a perovskite crystal structure to thereby crystallize the Pb(Zr,Ti)O$_3$ [PZT] layer 2b.

Figure 6:
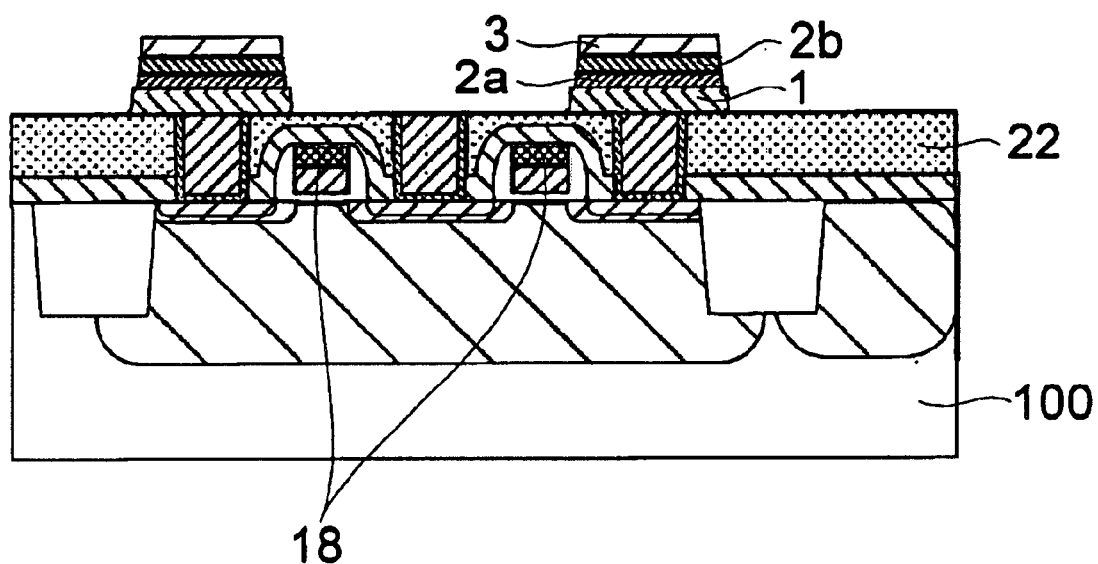

With reference to FIG. 6, the ferroelectric capacitor is etched and thereby yields a two-dimensionally stacked ferroelectric capacitor.

Figure 7:
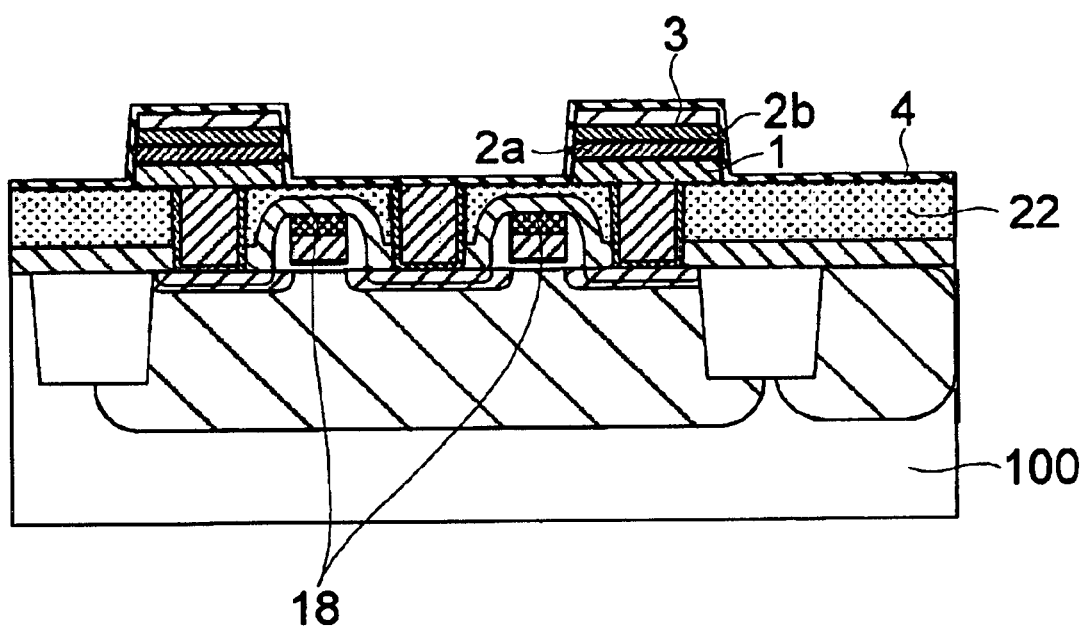
Figure 8:
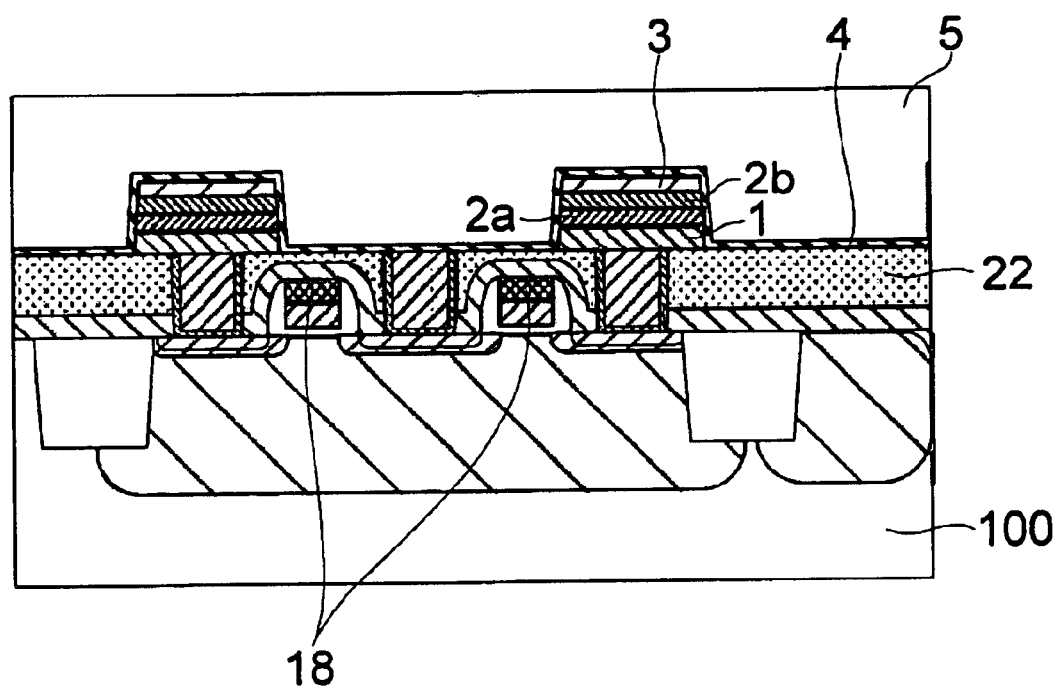
Figure 9:
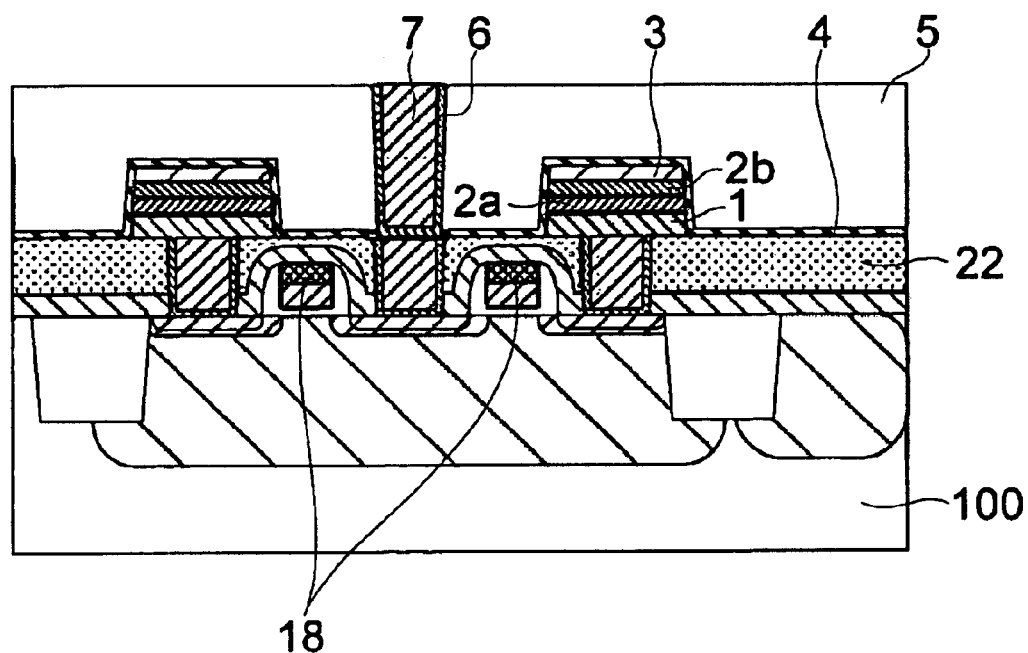
Figure 10:
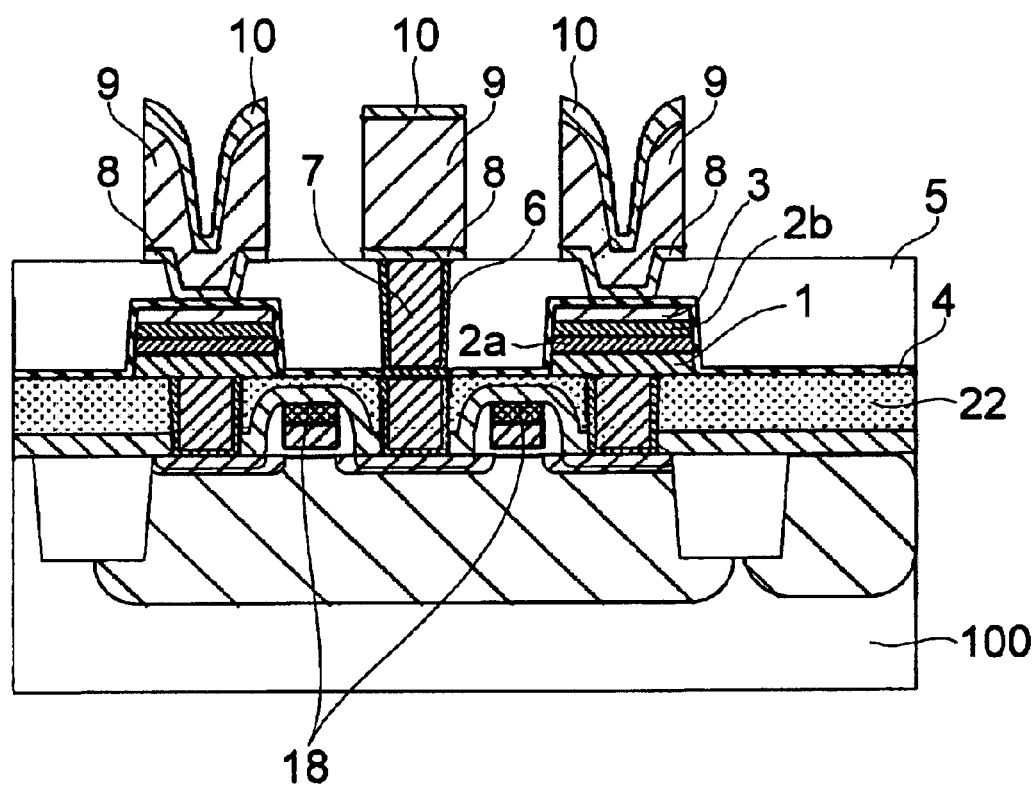

With reference to FIG. 7, a protecting film 4 composed of, for example, Pb(Zr,Ti)O$_3$ [PZT] is formed on the surface of the ferroelectric capacitor. With reference to FIG. 8, an interlayer dielectric film 5 composed of, for example, tetraethyl orthosilicate (TEOS) is formed on the protecting film 4 and is then flattened by chemical-mechanical polishing (CMP). With reference to FIG. 9, a plug-contact area is opened in the interlayer dielectric film 5, a TiN/Ti layer 6 and a W layer 7 are sequentially formed and are subjected to chemical-mechanical polishing (CMP) to form a plug. With reference to FIG. 10, a TiN/Ti layer 8, an Al layer (or Al—Cu layer) 9 and a Ti/TiN layer 10 are sequentially formed and are patterned and etched to form a wiring layer. Then, a cycle of interlayer formation, chemical-mechanical polishing (CMP), plug opening, plug formation, wiring formation, wiring patterning, and wiring etching is sequentially repeated to form a multilayer structure.

Thus, the semiconductor device of the present invention having the ferroelectric capacitor of the present invention is produced.

The semiconductor devices of the present invention have a large capacity, show less variation in polarization even upon repetitive switching process, can be rewritten at high speed in a large number of cycles and consume less power. Thus, the semiconductor devices are suitably used in various fields and especially suitably used as, for example, large-capacity nonvolatile memories in personal digital assistants, memory backup for game machines, displays, personal computers, printers, televisions, digital cameras, and other office automation appliances.

The present invention will be illustrated in further detail with reference to several examples and a comparative example below, which are never intended to limit the scope of the present invention.

EXAMPLE 1

A ferroelectric capacitor 50 shown in FIG. 1 was produced in the following manner.

Initially, a lower electrode 1 was formed by sputtering to a thickness of about 150 nm on a SiO$_2$ film 30 on a silicon substrate 100.

A Pb(Zr,Ti)O$_3$ [PZT] film 2a was formed by MOCVD on the lower electrode 1. More specifically, the Pb(Zr,Ti)O$_3$ [PZT] film was formed at a temperature of 620° C. feeding Pb(DPM)$_2$ as a Pb source at 0.37 ml/min., Zr(dmhd)$_4$ as a Zr source at 0.31 ml/min., and Ti(O-iPr)$_2$(DPM)$_2$ as a Ti source at 0.21 ml/min. at an oxygen partial pressure of 5 Torr (666 Pa). Each of these materials was dissolved in tetrahydrofuran (THF) in a concentration of 3% by mole to yield a solution, and the solution was conveyed to a vaporizer. The solution containing THF and the material was vaporized at 260° C. in the vaporizer, was mixed with oxygen gas to form a source gas, and the source gas was sprayed to the lower electrode using a showerhead. The film-forming time of the Pb(Zr,Ti)O$_3$ [PZT] film 2a was 480 seconds.

Figure 2:
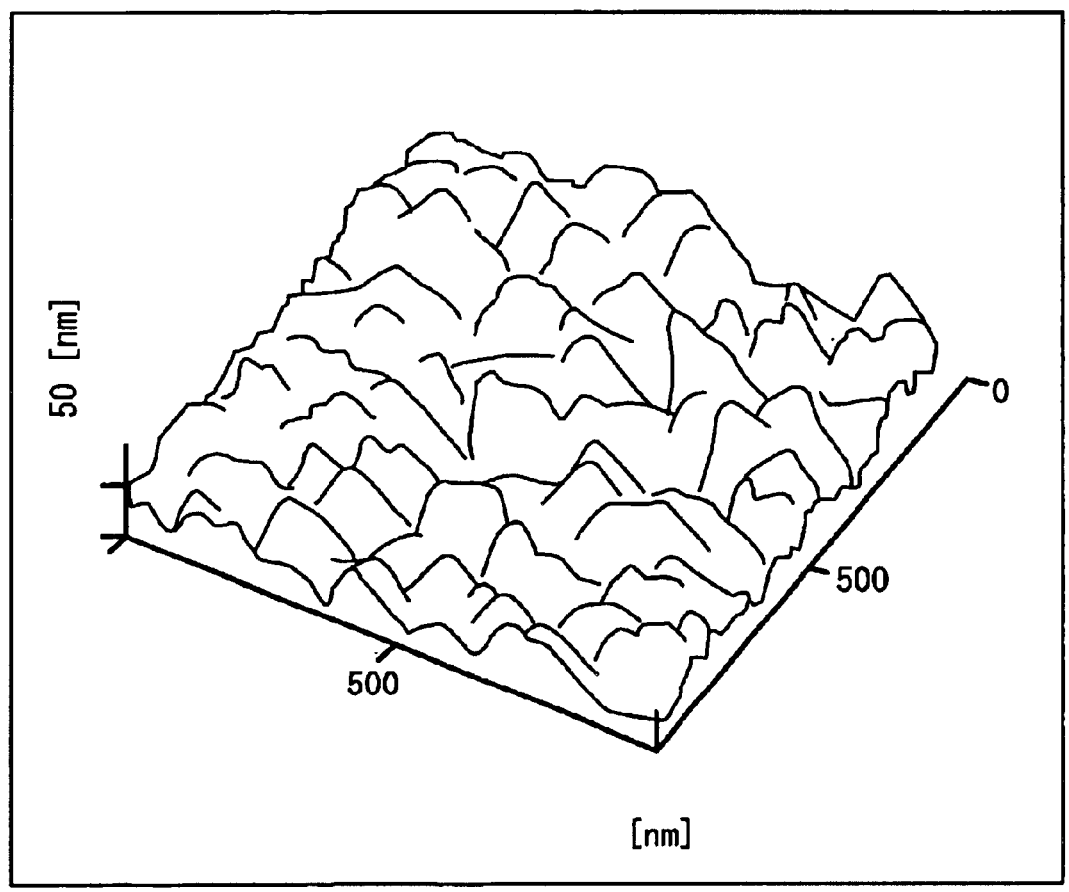
FIG. 2 is a schematic view of a fine structure of a surface of Pb(Zr,Ti)O$_3$ [PZT] film formed by MOCVD in Example 1, as determined with atomic force microscope (AFM).

The Pb(Zr,Ti)O$_3$ [PZT] film 2a formed by MOCVD was observed on its surface with an atomic force microscope (AFM) and was found to have a surface as shown in FIG. 2 with a surface roughness RMS of 13 nm.

Next, a Pb(Zr,Ti)O$_3$ [PZT] film 2b having an amorphous structure and containing 3% by mole of La corresponding to an A-site of a perovskite crystal structure was formed at normal temperature on the MOCVD-Pb(Zr,Ti)O$_3$ [PZT] film 2a. More specifically, the Pb(Zr,Ti)O$_3$ [PZT] film 2b was formed by sputtering at an input power of 1.5 kW using (Pb,La,Ca,Sr)(Zr,Ti)O$_3$ as a target in an atmosphere of Ar gas. A chamber was evacuated and was adjusted to a pressure of 0.5 Pa while supplying the Ar gas.

The Pb(Zr,Ti)O$_3$ [PZT] film 2b having an amorphous structure was observed with an atomic force microscope (AFM) and was found to have a surface roughness RMS of 3 nm.

A film of IrO$_2$ as an upper electrode 3 was formed by sputtering to a thickness of about 200 nm on the Pb(Zr,Ti)O$_3$ [PZT] film 2b having an amorphous structure to form a ferroelectric capacitor 50. The entire ferroelectric capacitor 50 was then subjected to rapid thermal annealing (RTA) at 725° C. to thereby convert the Pb(Zr,Ti)O$_3$ [PZT] film 2b from the amorphous structure to a perovskite crystal structure. Thus, the ferroelectric capacitor of Example 1 was produced.

COMPARATIVE EXAMPLE 1

A ferroelectric capacitor of Comparative Example 1 was produced by the procedure of Example 1, except that a Pb(Zr,Ti)O$_3$ [PZT] film having an amorphous structure was not formed on the MOCVD-Pb(Zr,Ti)O$_3$ [PZT] film.

The fatigue of the ferroelectric capacitors of Example 1 and Comparative Example 1 was determined by the following method. The results are shown in FIG. 3.

Fatigue

The polarization of a sample ferroelectric capacitor was reversed by applying pulses at 3 V, and the switched charge Qsw was determined at 1.8 V.

Figure 3:
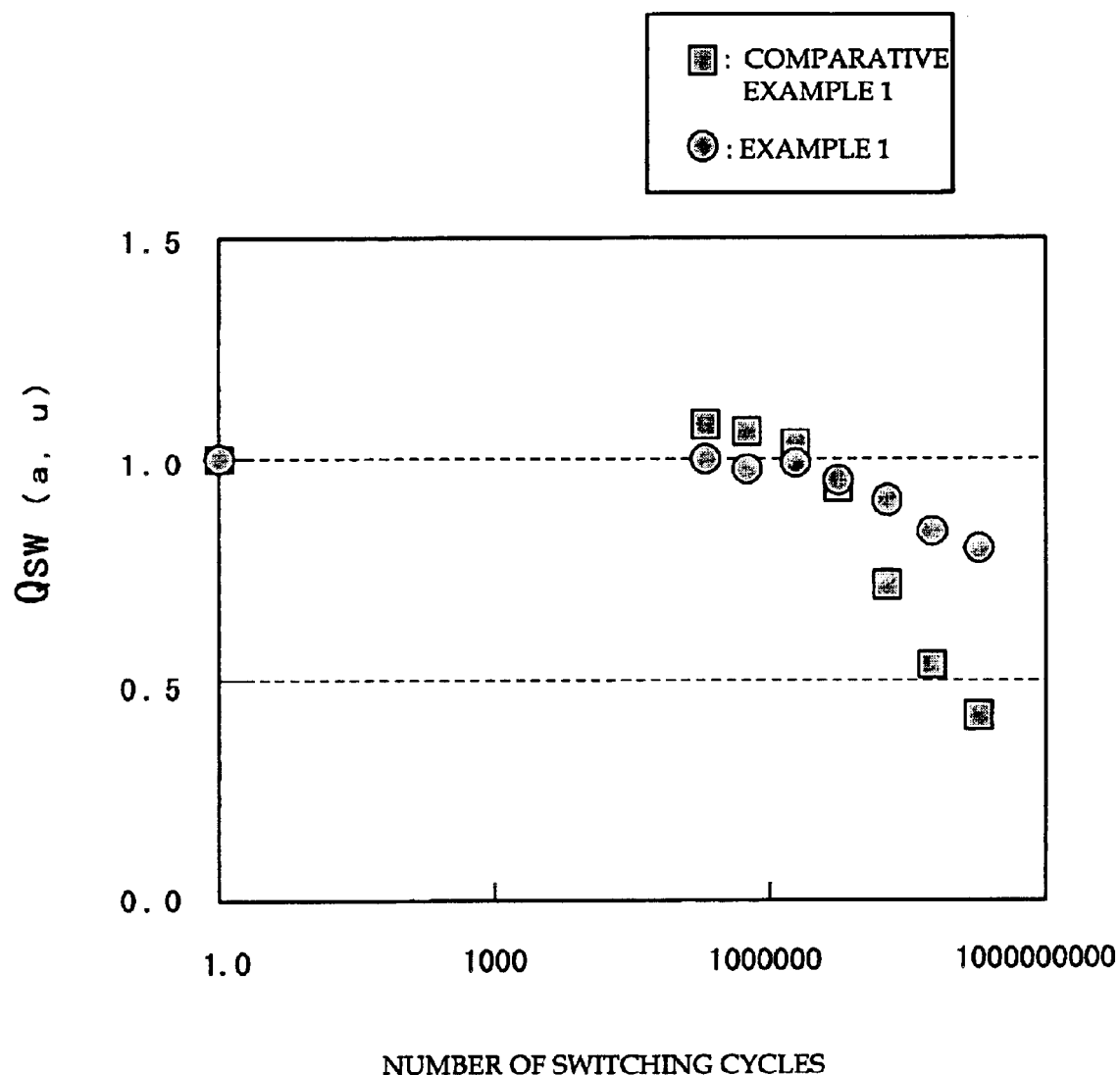
FIG. 3 is a graph showing the relationship between the number of switching process and the reversed (switched) electric charge Qsw in ferroelectric capacitors according to Example 1 and Comparative Example 1.

FIG. 3 shows that the ferroelectric capacitor of Comparative Example 1 having no Pb(Zr,Ti)O$_3$ [PZT] film on the MOCVD-Pb(Zr,Ti)O$_3$ [PZT] film shows a decreased Qsw, 40% of an initial Qsw, after 2×10$^8$ cycles of polarization reversal; in contrast, the ferroelectric capacitor of Example 1 having the Pb(Zr,Ti)O$_3$ [PZT] film with a perovskite crystal structure converted from an amorphous structure on the MOCVD-Pb(Zr,Ti)O$_3$ [PZT] film shows less decreased Qsw, i.e., 80% of the initial Qsw, even after 2×10$^8$ cycles of polarization reversal, indicating that the ferroelectric capacitor of the present invention exhibits reduced fatigue as compared with the ferroelectric capacitor of Comparative Example 1.

EXAMPLE 2

Production of Semiconductor Device

The semiconductor device was produced in the following manner.

Initially, as shown in FIG. 4, an element-separation dielectric film was formed by local oxidation of silicon (LOCOS) on a surface of a silicon Si substrate 100 to define and separate an element region. The element-separation dielectric film can be formed by LOCOS or by forming grooves on the silicon substrate and embedding a dielectric film in the grooves. The silicon substrate 100 may be of either n-type or p-type.

A transistor having a side-wall dielectric film with a gate electrode 18 and a source-drain doped layer was formed in the element region. An interlayer dielectric film 22 composed of a silicone oxide was entirely formed by CVD, followed by smoothing the surface of the interlayer dielectric film 22 by chemical-mechanical polishing (CMP).

Next, contact holes reaching the source-drain doped layer were formed in the interlayer dielectric film 22 by photolithography, and a Ti film and a TiN film were sequentially formed by sputtering on the entire surface of the resulting article to form a coherent layer comprising the Ti film and TiN film. Next, a tungsten (W) layer was formed by CVD on the entire surface of the coherent layer. Thus, the coherent layer and the tungsten layer were formed on the interlayer dielectric film 22 and inside the contact holes.

The coherent layer and the tungsten layer were polished by chemical-mechanical polishing so as to expose the surface of the interlayer dielectric film 22 to thereby form electrically conductive plugs 24 comprising the coherent layer and the tungsten layer embedded in the contact holes, as shown in FIG. 4.

With reference to FIG. 5, a lower electrode 1 composed of Ir was formed with sputtering. A Pb(Zr,Ti)O$_3$ [PZT] layer 2a was formed by MOCVD on the lower electrode 1 heated at 400° C. to 700° C.; a Pb(Zr,Ti)O$_3$ [PZT] layer 2b having an amorphous structure was formed by sputtering on the Pb(Zr,Ti)O$_3$ [PZT] layer 2a; and an upper electrode 3 was formed on the Pb(Zr,Ti)O$_3$ [PZT] layer 2b having an amorphous structure. The entire ferroelectric capacitor was subjected to rapid thermal annealing (RTA) at 725° C. to convert the Pb(Zr,Ti)O$_3$ [PZT] layer 2b from the amorphous structure to a perovskite crystal structure to thereby crystallize the Pb(Zr,Ti)O$_3$ [PZT] layer 2b.

With reference to FIG. 6, the ferroelectric capacitor was etched and thereby yielded a two-dimensionally stacked ferroelectric capacitor.

With reference to FIG. 7, a protecting film 4 composed of, for example, Pb(Zr,Ti)O$_3$ [PZT] was formed on the surface of the ferroelectric capacitor. With reference to FIG. 8, an interlayer dielectric film 5 composed of, for example, tetraethyl orthosilicate (TEOS) was formed on the protecting film 4 and was then flattened by chemical-mechanical polishing (CMP). With reference to FIG. 9, a plug contact area was opened in the interlayer dielectric film 5, a TiN/Ti layer 6 and a W layer 7 were sequentially formed and were subjected to chemical-mechanical polishing (CMP) to form a plug. With reference to FIG. 10, a TiN/Ti layer 8, an Al layer (or Al—Cu layer) 9 and a Ti/TiN layer 10 were sequentially formed, patterned and etched to form a wiring layer. Then, a cycle of interlayer formation, chemical-mechanical polishing (CMP), plug opening, plug formation, wiring formation, wiring patterning, and wiring etching was sequentially repeated to form a multilayer structure.

Thus, the semiconductor device of the present invention having the ferroelectric capacitor was produced.

The present invention can solve the problems in conventional ferroelectric capacitors and can provide a ferroelectric capacitor which exhibits reduced fatigue and is suitable as a large-capacity nonvolatile memory, a process for efficiently producing the ferroelectric capacitor, and a high-performance semiconductor device having the ferroelectric capacitor.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A ferroelectric capacitor comprising:
   a pair of electrodes; and
   at least one ferroelectric held between the pair of electrodes,
   wherein the at least one ferroelectric comprises:
      a first ferroelectric layer having a surface roughness (RMS) determined with an atomic force microscope of 10 nm or more; and
      a second ferroelectric layer being arranged adjacent to the first ferroelectric layer and having a surface roughness (RMS) determined with an atomic force microscope of 5 nm or less.

2. A ferroelectric capacitor according to claim 1, wherein the second ferroelectric layer is so arranged as to fill depressions on the surface of the first ferroelectric layer.

3. A ferroelectric capacitor according to claim 1, wherein the first ferroelectric layer is formed at a temperature equal to or higher than a crystallization temperature at which the first ferroelectric layer takes on a crystalline structure displaying ferroelectricity, and wherein the second ferroelectric layer is formed at a temperature lower than a crystallization temperature at which the second ferroelectric layer takes on a crystalline structure displaying ferroelectricity.

4. A ferroelectric capacitor according to claim 1, wherein the first ferroelectric layer is formed at a temperature equal to or higher than 500° C., and wherein the second ferroelectric layer is formed at a temperature lower than 500° C.

5. A ferroelectric capacitor according to claim 1, wherein the first ferroelectric layer has a perovskite crystal structure and wherein the second ferroelectric layer has a perovskite crystal structure converted from an amorphous structure.

6. A ferroelectric capacitor according to claim 5, wherein the second ferroelectric layer has a perovskite crystal structure converted from an amorphous structure as a result of a thermal treatment.

7. A ferroelectric capacitor according to claim 6, wherein the thermal treatment is one of reduced-pressure rapid thermal annealing (RTA) at a temperature higher than the film forming temperature of the first ferroelectric layer and normal-pressure rapid thermal annealing (RTA) at a temperature higher than the film forming temperature of the first ferroelectric layer.

8. A ferroelectric capacitor according to claim 1, wherein the ferroelectric is at least one selected from the group consisting of $Pb(Zr,Ti)O_3$ [PZT], $SrBi_2Ta_2O_9$ [SBT], and $Bi_4Ti_3O_{12}$ [BIT].

9. A ferroelectric capacitor according to claim 1, wherein the first ferroelectric layer comprises $Pb(Zr,Ti)O_3$ [PZT] having a perovskite crystal structure and wherein the second ferroelectric layer comprises $Pb(Zr,Ti)O_3$ [PZT] having a perovskite crystal structure converted from an amorphous structure.

10. A ferroelectric capacitor according to claim 1, wherein the second ferroelectric has a perovskite crystal structure, except with its A-site doped with at least one selected from the group consisting of La, Sr, Ba and Ca.

11. A ferroelectric capacitor according to claim 1, wherein the second ferroelectric has a perovskite crystal structure, except with its B-site doped with at least one selected from the group consisting of Nb, Ta, W and Bi.

12. A ferroelectric capacitor according to claim 1, wherein at least one of the pair of electrodes comprises at least one selected from the group consisting of $IrO_2$, $RuO_2$, $SrRuO_3$, and $La_{2-x}Sr_xCuO_4$, wherein x is more than 0 and is 1 or less.

13. A ferroelectric capacitor according to claim 1, comprising one of the pair of electrodes, the first ferroelectric layer, the second ferroelectric layer, and the other of the pair of electrodes in this order, wherein the first ferroelectric layer has columnar crystals, and wherein the second ferroelectric layer has granular crystals.

14. A semiconductor device comprising:
a substrate; and
a ferroelectric capacitor arranged above the substrate,
wherein the ferroelectric capacitor comprises:
a pair of electrodes; and
at least one ferroelectric held between the pair of electrodes,
wherein the at least one ferroelectric comprises:
a first ferroelectric layer having a surface roughness (RMS) determined with an atomic force microscope of 10 nm or more; and
a second ferroelectric layer being arranged adjacent to the first ferroelectric layer and having a surface roughness (RMS) determined with an atomic force microscope of 5 nm or less.

* * * * *